United States Patent [19]

Ikeda et al.

[11]  4,292,392

[45]  Sep. 29, 1981

[54] PROTECTIVE LAYER OF FATTY ACID OR NYLON ON PHOTOSENSITIVE RESIN FOR METAL-IMAGE FORMING ELEMENT

[75] Inventors: Tomoaki Ikeda; Fumiaki Shinozaki; Sho Nakao, all of Minami-ashigara, Japan

[73] Assignee: Fuji Photo Film Co., Ltd., Minami-ashigara, Japan

[21] Appl. No.: 199,122

[22] Filed: Oct. 22, 1980

Related U.S. Application Data

[63] Continuation of Ser. No. 17,669, Mar. 5, 1979, abandoned, which is a continuation of Ser. No. 772,044, Feb. 25, 1977, abandoned.

[30] Foreign Application Priority Data

Feb. 25, 1976 [JP] Japan .................................. 51-19786

[51] Int. Cl.³ .............................................. G03C 1/68
[52] U.S. Cl. .................................. 430/271; 430/273; 430/961; 430/302; 430/276
[58] Field of Search ................ 430/271, 961, 276, 302

[56] References Cited

U.S. PATENT DOCUMENTS

| | | | |
|---|---|---|---|
| 2,331,746 | 10/1943 | Talbot | 96/50 PL |
| 3,046,115 | 7/1962 | Schmidt et al. | 96/86 R |
| 3,046,121 | 7/1962 | Schmidt et al. | 96/91 D |
| 3,046,131 | 7/1962 | Schmidt et al. | 96/33 |

*Primary Examiner*—John D. Welsh
*Attorney, Agent, or Firm*—Sughrue, Mion, Zinn, Macpeak and Seas

[57] ABSTRACT

A metal image-forming material comprising a support, a metal image-forming layer formed on the support and a photosensitive resin layer formed on the metal image-forming layer, with a protective layer of an organic compound (such as a higher fatty acid or an amide thereof or an alcohol-soluble nylon) further provided on the photosensitive layer resin. The photosensitive resin layer has improved scratch resistance, and good antiblocking property with respect to itself and to the surface of the support.

23 Claims, 1 Drawing Figure

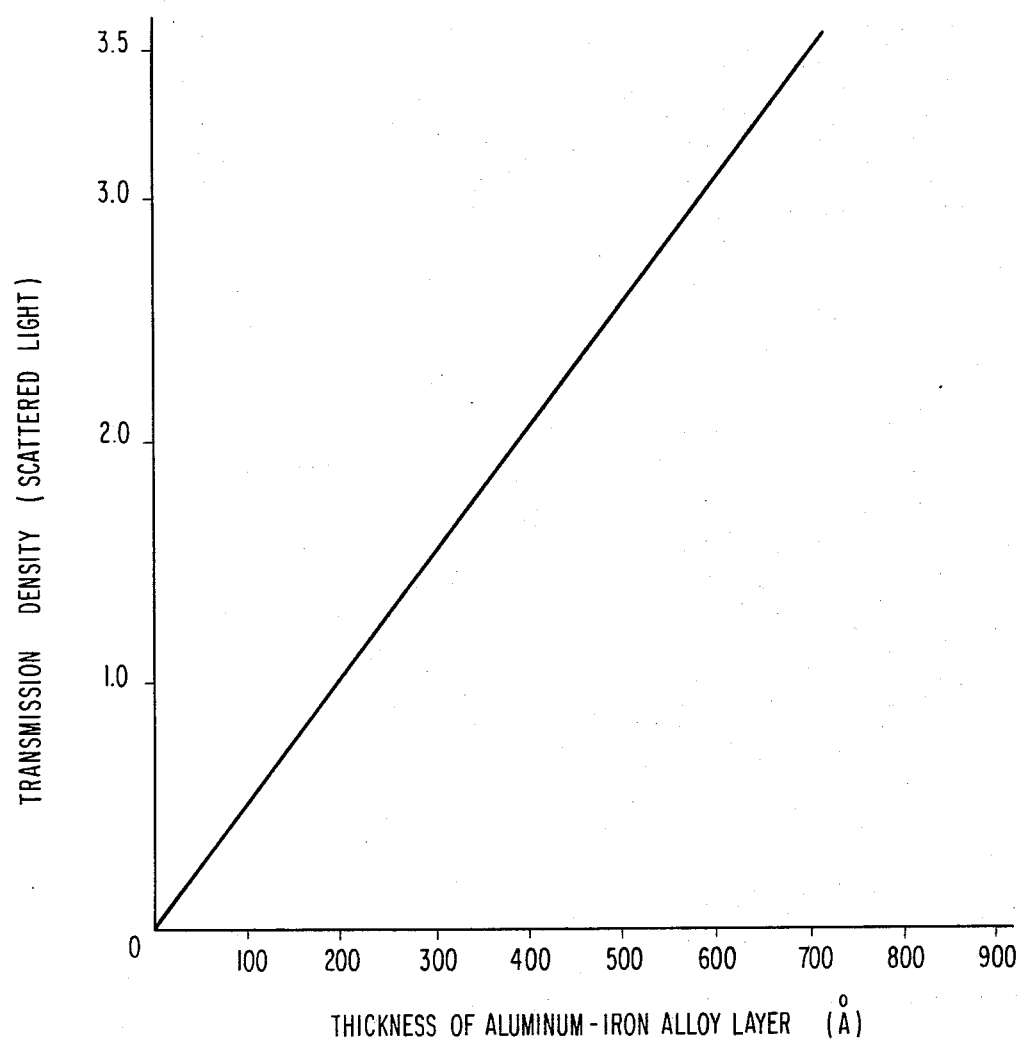

PROTECTIVE LAYER OF FATTY ACID OR NYLON ON PHOTOSENSITIVE RESIN FOR METAL-IMAGE FORMING ELEMENT

This is a Continuation of application Ser. No. 17,669, filed Mar. 5, 1979 which is a Continuation of application Ser. No. 772,044, filed Feb. 25, 1977, both now abandoned.

BACKGROUND OF THE INVENTION

1. Field of the Invention

This invention relates to a material for forming a metal image, and more specifically, to an improvement in a metal image-forming material capable of forming an image of high contrast and suitable for halftone dots or lines.

2. Description of the Prior Art

Generally, very high contrast lithographic films have heretofore been used as an image-forming material suitable for halftone dots or lines. Lithographic films are photographic materials for forming an image composed of a transparent portion and a completely non-transparent portion, and are characterized in that the edge of the image is clear, and accurate line widths can be obtained. With lithographic films, it is desirable for the image formed to be clearly separated into a transparent portion and a blackened portion with high contrast. When an image is formed using a lithographic film, however, some "rising width" (toe of characteristic curve) exists from the density of the support film to the image area as shown by the characteristic curve thereof, and appears as a fringe at the periphery of the image. Furthermore, since the development of a lithographic film is based on infectious development, the image increases in size and grows as development proceeds. For this reason, development cannot be stopped instantaneously, and even immediately after stopping the development, the development proceeds slightly. This is also considered to be responsible for fringe formation. As a result, images of ideal quality cannot be produced using lithographic films.

Photographic materials composed of a transparent plastic film and a photosensitive resin layer formed thereon were developed in an attempt to solve the problems associated with such lithographic films. These photographic materials can be handled in a bright room which is convenient for processing, and also conserve use of silver. However, these types of photographic materials have the disadvantage that photographic materials of this type cannot be used to obtain high density images, and the size reduction of halftone dots, a property required of so-called "reversal films", is difficult.

Extensive investigations have now been made in an attempt to solve the problems associated with the lithographic films and the photographic materials having a photosensitive resin layer (or photoresist) which have been described hereinabove. This work led to the development of a metal image-forming material composed of a support, a metal image-forming layer formed thereon, and a top layer of a photosensitive resin. In such a metal image-forming material, the adhesion of the photosensitive resin layer to the metal image-forming layer is generally weak, and the photosensitive resin layer peels off partly. Moreover, since the surface of the material is tacky, it sometimes sticks to an image-bearing film used for contact printing, or the surface becomes somewhat soft and weak due to the action of an alkaline etching solution used for development. In particular, pinholes are sometimes caused in the photosensitive resin layer due to the action of a strongly alkaline processing solution used for reduction after the formation of a metal image.

SUMMARY OF THE INVENTION

Accordingly, an object of this invention is to provide a metal image-forming material which solves the problems of the conventional metal image-forming material described above, and in which the film strength of the surface is markedly improved and the adhesivity of the surface to another surface is removed.

The present invention provides a metal image-forming material comprising a support, a metal image-forming layer formed on the support, and a photosensitive resin layer on the metal image-forming layer wherein a protective layer composed of an organic compound is formed additionally on the photosensitive resin layer.

BRIEF DESCRIPTION OF THE DRAWING

The FIGURE is a graph showing the relationship between the thickness of an aluminum-iron alloy layer as a metal image-forming layer on a support and the optical density achieved therewith.

DETAILED DESCRIPTION OF THE INVENTION

The metal image-forming layer in the metal image-forming material of this invention is a layer composed of a metal that can be etched with known alkaline etching solutions. Examples of suitable metals are metals composed mainly of aluminum (e.g., in an amount of about 75 to about 99.8 atomic %) as disclosed, for example, in Japanese Patent Application (OPI) No. 139,720/75 (corresponding to U.S. Patent Application Ser. No. 571,817 filed Apr. 25, 1975), and tellurium, molybdenum, polonium, cobalt, zinc, copper, nickel, iron, tin, vanadium, germanium, silver, and a silver emulsion disclosed, for example, in Japanese Patent Application (OPI) Nos. 65927/72, (corresponding to U.S. Patent Application Ser. No. 205,860, filed Dec. 8, 1971), 65928/73 (corresponding to U.S. Patent Application Ser. No. 205,861, filed Dec. 8, 1971), and 2925/75 (corresponding to U.S. Patent Application Ser. No. 350,372, filed Apr. 12, 1973), and Japanese Patent Publication No. 14161/75. Aluminum-iron alloys (aluminum: about 90 to about 99.9 atomic %; iron: about 0.1 to about 10 atomic %) are also suitable as the metal image-forming layer.

The thickness of the metal image-forming layer is determined by the optical density required of the resulting image. The thickness and the optical density are substantially proportional to each other. For example, when the image is a line or a halftone dot, a relatively high density, for example, an optical density of at least about 2.0, is required. When the material of this invention is used as a mask for printing onto a pre-sensitized (PS) printing plate, the image must have an optical density of at least about 3.0. Accordingly, the thickness of the metal image-forming layer is determined by the optical densities required. This is illustrated by referring to the FIGURE which is a graph showing the relationship, determined experimentally, between the thickness of an aluminum-iron alloy layer and the optical density of the image in one example of the metal image-forming material of this invention. It can be seen from the FIGURE that the thickness of the alloy layer should be about 400 Å in order to obtain an optical density of 2.0, and a thickness of about 600 Å is required in order to obtain an optical density of 3.0. This relationship between the thickness of the metal image-forming layer and the optical density remains substantially the same although it will vary somewhat depending on the method for forming the metal image-forming layer, for example, depending on the vacuum deposition conditions used. Although the thickness of the metal image-forming layer can be increased beyond the required level in order to obtain the desired optical density, this is not desirable because the material for the metal image-forming layer is wasted, and an excessively long time is consumed in etching the metal image-forming layer for image formation. In view of the fact that resists sometimes deteriorate because of an excessively long etching time is used, formation of a metal image-forming layer having a thickness beyond the required level should rather be avoided.

The support of the material of this invention retains the metal image-forming layer thereon either directly or indirectly (through another layer such as a subbing layer), and may have various forms depending on the intended uses of the metal image-forming material of this invention. On considering the forms conventional image-forming materials can have, the support of the metal image-forming material of this invention is preferably in the form of a sheet, a film or a plate. According to the intended use, the support may be transparent, semi-transparent or opaque. For example, in forming a mask (e.g., an optical mask or a photomask) material, the support must be transparent. The term "transparent" as used herein means the support will transmit not less than about 40% preferably 70% on more of light having a wavelength ranging from about 200 nm to about 700 nm, preferably from about 290 nm to about 650 nm. When a transparent support(sheet) is used, the support preferably has a thickness of about 10 μm to about 1 mm. The support should not be attacked by the etching solution used for etching the metal image-forming layer, and should be such that a peeling or a tendency toward peeling of a layer formed thereon does not occur. Suitable materials for the support can be many known materials, such as ceramics, amorphous glass, crystalline glass, metals, alloys, plastics, and composites of these materials. Specific examples of suitable supports include films, sheets or plates of, for example polyethylene terephthalate, polyethylene isophthalate, polycarbonate of bisphenol A, cellulose triacetate, cellulose diacetate, cellulose acetate butyrate, cellulose acetate propionate, cellulose nitrate, polystyrene, polymethyl acrylate, polymethyl methacrylate and the like, a paper laminated with a polyolefin such as polyethylene, polypropylene, an ethylene-butene copolymer, a glass or quartz glass sheet or plate, etc. These materials can be non-transparent or transparent. If desired, transparent materials may be rendered semi-transparent or opaque by adding coloring agents or opacifying agents thereto. However, in many of the possible areas of utility, the metal image-forming material of this invention is used in "transmission-type applications" in which an image is formed in the metal image-forming layer, the non-image area where the support is uncovered with the removal of the metal image-forming layer is rendered transparent, and the image area is shielded from light by the metal image-forming layer. In such areas, the support must be transparent. On the other hand, in applications where the resulting image is viewed by reflecting light, the support does not need to be transparent.

The photosensitive resin in the photosensitive layer of the image-forming material of this invention which can be used includes various types of photosensitive resins used for photoetching resists, for example, (1) photosensitive resins composed of ortho-quinone diazides and a novolak resin, (2) rubber-azide photosensitive resins composed of azide compounds and natural or synthetic rubbers or cyclized products thereof, (3) photosensitive resins having an azide group in the molecule, (4) cinnamic acid-type photosensitive resins, and (5) photopolymerizable photosensitive resins containing an ethylenically unsaturated double bond. In addition, examples of photosensitive resins which can be used are disclosed in J. Kosar, *Light-Sensitive Systems* John Wiley and Sons, Inc., New York (1965).

Examples of photosensitive resins (1) composed of a combination of an ortho-quinone diazide and a novolak resin (e.g., soluble and softenable resins obtained by condensation of phenols and formaldehyde in the presence of an acidic catalyst) are those composed of a novolak resin and ortho-quinone diazides such as 2,3,4-trioxybenzophenone-bis-(naphthoquinone-1,2-diazido-5,5-sulfonic acid ester), 2-(naphthoquinone-1,2-diazido-5-sulfonyloxy)-hydroxy-7-naphthalene, naphthoquinone-1,2-diazido-5-sulfanilide, or naphthoquinone-1,2-diazido-5-sulfonic acid novolak ester. Ortho-quinone diazides are important as materials for positive working because they become alkali solution-soluble upon exposure to light.

Examples of rubber-azide photosensitive resins (2) are those composed of azide compounds such as p-phenylenebis-azide, p-azidobenzophenone, 4,4'-diazidobenzophenone, bis(4-azidophenyl)methane, 4,4'-diazidostilbene, 4,4'-diazidochalcone, 2,6-bis(4-zidobenzal)cyclohexanone or 2,6-bis(4-azidobenzal)-4-methylcyclohexanone, and natural rubbers e.g., polyisoprenes having a cis-1,4-addition structure, synthetic rubbers e.g., polyisoprenes having a cis-1,4-addition, trans-1,4-addition 1,2-addition or 3,4-addition structure, or cyclization products of such rubbers e.g., rubbers where a cyclic structural moiety is introduced into the natural or synthetic rubber molecule.

Examples of photosensitive, resins (3) containing an azide group in the molecule are poly(azidovinyl benzoate), poly(azidovinyl phthalate), polyazidostyrene, poly(vinylazide benzal acetal), poly(vinyl azide naphthyl acetal), azidobenzaldehyde, azidophenylamine/-formaldehyde condensation polymers, an azidopolymer of polyvinyl alcohol, azide polymers of cellulose such as an azidophthalate of partially hydrolyzed cellulose acetate, and an azide polymer of gelation or casein.

Examples of cinnamic acid-type photosensitive resins (4) include vinyl polymers such as poly(vinyl cinnamate), poly(vinyl m-nitrocinnamate), poly(vinyl α-cyanocinnamate), poly(vinyl α-nitrocinnamate), poly(vinyl β-nitrocinnamate), poly(vinyl α-chlorocinnamate), poly(vinyl β-chlorocinnamate), poly(vinyl cinnamylideneacetate), poly(vinyloxyethyl cinnamate), poly(vinyl thioethyl cinnamate), poly(2-cinnamolyoxyethyl acrylate), poly(2-cinnamoyloxyethyl methacrylate), poly(vinyl cinnamolyoxyacetate), poly(p-cinnamoyloxy vinylbenzene), and poly(p-cinnamoyl styrene); copolymers of the monomers of these homopolymers with other polymers copolymerizable therewith; ring-opened polymers of oxiranes such as poly(glycidyl cinnamate) and poly(glycidyl cinnamylideneacetate);

polymers prepared by subjecting polymers having a haloalkyl group in the side chain to a polymer reaction with carboxylic acid salts containing a photosensitive group in aprotic polar solvents to introduce the photosensitive group either completely or partly, for example, polymers obtained by reacting poly(chloroethyl vinyl ether), poly(vinyl chloroacetate), poly(β-chloroethyl acrylate), polyepichlorophydrin or polyepibromohydrin with salts of cinnamic acid or derivatives thereof; and cationically polymerized polymers of vinyl ethers such as poly(vinyloxyethyl cinnamate).

Of the cinnamic acid-type photosensitive resins, mixtures of photosensitive unsaturated polyester compounds and photosensitive resins having the following chemical structural formula, as disclosed in U.S. Pat. No. 3,030,208, are very suitable. The above photosensitive resins are polymers having units (A) of the formula

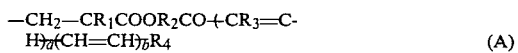

wherein $R_1$ is a hydrogen atom, a halogen atom (such as a chlorine, iodine, bromine etc. atom), a nitrile group or a lower alkyl group (such as a methyl, ethyl, propyl, butyl, pentyl, isopropyl, isobutyl, etc., group), $R_2$ is a divalent aliphatic group (such as a methylene, ethylene, trimethylene, tetramethylene, pentamethylene, propylene, etc., group), $R_3$ is a hydrogen atom or a nitrile group, $R_4$ is an aromatic nucleus (such as a phenyl, tolyl, ethylphenyl, xylyl, propylphenyl, etc., group), and a and b are 0 or 1, and a+b is 1 or 2, and units (B) of acrylic acid or methacrylic acid having the formulae

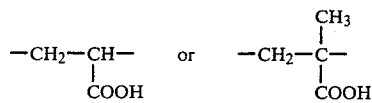

Examples of photopolymerizable photosensitive resins containing an ethylenically unsaturated double bond (5) are described in detail in, for example, U.S. Pat. Nos. 2,760,863 and 3,060,026 as to appropriate monomers and polymerizable combinations thereof. Suitable monomers are, for example, acrylate or methacrylate esters of polyhydric alcohols. Specific examples include acrylate or methacrylate esters of ethylene glycol, triethylene glycol, tetraethylene glycol, propylene glycol, trimethylol propane, pentaerythritol, or neopentyl glycol. Acrylate or methacrylate esters derived from bisphenol A, such as a reaction product of a bisphenol A/epichlorohydrin type epoxy resin prepolymer with acrylic acid or methacrylic acid, or an acrylate or methacrylate ester of an alkylene oxide adduct of bisphenol A or the hydrogenation product thereof, can also be used. Other useful photopolymerizable resins (5) include methylenebis acrylamide, ethylenebis acrylamide, bisacrylamides or bismethacrylamides of diamines such as ethylene diamine, propylene diamine, butylene diamine or pentamethylene diamine, reaction products formed between diol monoacrylates or diol monomethacrylates and diisocyanates, trivinyl formal, and triallyl cyanurate.

As described hereinabove, the metal image-forming material of this invention is characterized by the fact that a protective layer composed of an organic compound is formed on the photosensitive resin layer. Examples of suitable organic compounds which can be used to form such a protective layer are higher fatty acids e.g., which can be saturated or unsaturated (preferably having 1 to 3 double bonds therein), having 11 to 31 carbon atoms excluding the carbon atom(s), of the carboxyl group(s) thereof such as lauric acid, palmitic acid, stearic acid, arachidic acid, behenic acid, oleic acid, linolenic acid, azelaic acid, sebacic acid, dodecanedioic acid, and tetradecanedioic acid; amides of these higher fatty acids (such as palmitic acid amide, stearic acid amide, arachidamide, behenamide, lignoceramide, montanamide etc.); hydrocarbons containing at least 20, preferably at least 25, carbon atoms; quaternary salts containing an alkyl group with at least 12 carbon atoms (such as ethyldimethylcetylammonium bromide (or chloride), trimethyloctadecylammonium bromide (or chloride) etc.); various waxes (esters of a higher fatty acid and a higher monohydric alcohol or diol such as carnauba wax, etc.); natural and synthetic rubbers (e.g., synthetic rubbers such as polyisoprene, polyisobutylene, etc.); synthetic polymers such as polystyrene, chlorinated polyolefins, polymethacrylates, phenolic resins, acetylcellulose, polyvinyl alcohol, a partial ester, ether or acetal or polyvinyl alcohol, polyvinyl acetate hydrolyzed to a degree of about 88 to 99%, an ethylene oxide polymer having an average molecular weight of about 100,000 to about 3,000,000, a methyl vinyl ether/maleic anhydride copolymer, and nyons; and natural resins such as rosin, gelatin or gum arabic.

The protective layer may be in the form of a film layer, or it may be present in a dispersed state on the photosensitive resin layer. In the case of a higher fatty acid or the amide thereof, the intended effect can be sufficiently obtained even when such is present almost as a monomolecular layer. In any case, the protective layer desirably has a thickness of not more than about 5μ. Further, when higher fatty acids or the amides thereof are employed, the protective layer preferably has a thickness of 0.005 to 0.5μ, and when alcohol soluble nylons are used, the protective layer preferably has a thickness of 0.1 to 3μ.

The material of the protective layer is determined by the material of the photosensitive resin layer and the processing solution used for development. For example, when an organic solvent is used as the processing solution, various organic materials can be used in the protective layer. When an alkaline aqueous solution is used as a developer in a monobath developing method to be described hereinbelow, it is necessary to choose an organic compound which will form a protective layer which permits the penetration of the alkaline aqueous solution. Examples of such organic compounds are higher fatty acids containing at least 12 carbon atoms, amides of such higher fatty acids, rosin, and alcohol-soluble nylon. The protective layer may contain various additives, such as dyes or pigments, a photosensitive color former or decolorizer, or a film surface modifier (e.g., colloidal silica). e.g., in an amount less than about 20% by weight, preferably less than about 10% by weight.

In the preparation of the metal image-forming material of this invention, a metal image-forming layer is first formed on the surface of a specific support using various methods such as vacuum deposition, sputtering, ion plating, electrodeposition, electrophoresis, vapor phase precipitation, or spraying e.g., as disclosed in, for example, Japanese Patent Application (OPI) Nos. 65927/73 (corresponding to U.S. Patent Application Ser. No. 205,860, filed Dec. 8, 1971), 65928/73 (corresponding to U.S. Patent Application Ser. No. 205,861, filed Dec. 8, 1971), 2925/75 (corresponding to U.S. Patent Application Ser. No. 350,372, filed Apr. 12, 1973), and 139720/75 (corresponding to U.S. Patent Application Ser. No. 571,817, filed Apr. 25, 1975) and Japanese Patent Publication No. 14161/75. Then, a photosensitive resin layer is formed on the metal image-forming layer. Subsequently, a protective layer containing the organic compound is formed on top of the photosensitive resin layer.

A coating solution for forming the photosensitive resin layer is prepared by dissolving one or more photosensitive resins exemplified hereinabove in an organic solvent, such as toluene, xylene, benzene, solvent, naphtha, ethyl acetate, butyl acetate, Cellosolve acetate, methyl ethyl ketone, 1,2-dichloroethane, ethylene chloride, methyl isobutyl ketone, diisobutyl ketone, cyclohexanone, carbon tetrachloride, trichloroethylene, perchloroethylene, chloroform, tetrahydrofuran, diethyl ether, dimethylformamide, N-methylpyrrolidone, or dioxane. Necessary sensitizers or additives are also added to the coating solution. When the photosensitive resin is not film-forming, a binder component capable of permitting the penetration of alkaline aqueous solutions, such as a copolymer of an alkyl methacrylate and methacrylic or acrylic acid, a copolymer of styrene and itaconic acid, an N-methlol acrylamide-modified methacrylic acid copolymer, or glycidyl methacrylate-modified hydroxypropyl methyl cellulose phthalate can be added to the coating solution. The ratio of the photosensitive material or component to the binder will vary depending upon the type of photosensitive material and the binder used and cannot be set forth unequivocally, but preferably about 0.01 to about 100 wt% of the binder based on the photosensitive material or component is used. The solution so prepared is coated on the metal image-forming layer using known methods such as roller coating, air knife coating, dip coating, curtain coating or spray coating, and then dried to form a photosensitive resin layer. An appropriate dry thickness of the photosensitive resin layer is about 0.1 to 10 µm. If the layer is too thin, the layer is weak as a resist layer. When the layer is too thick, too long a period of time is required for etching, and a resist image accurately corresponding to the exposed image cannot be easily obtained.

According to the present invention, the protective layer described above is further coated on the photosensitive resin layer. Usually, a solution of an organic compound is prepared, and the additives described above are added as needed. The resulting coating solution is coated on the photosensitive resin layer using one of the coating methods exemplified above in the formation of the photosensitive resin layer. At the time of forming the protective layer, the photosensitive resin layer should not be damaged nor dissolved. Hence, the solvent in the coating solution for the protective layer should be as solvent which does not dissolve the photosensitive resin layer, and therefore, suitable solvents should be chosen on this basis. Generally, liquid hydrocarbons such as pentane, hexane or heptane, mixtures of liquid hydrocarbons with other solvents, water, and mixtures of water and alcohols are especially preferred, and as needed, a wetting agent such as a surface-active agent may be added.

A metal image-forming image can be formed by imagewise exposing the resulting metal image-forming material using known techniques to light from a light source such as a super-high pressure mercury lamp, a metal halide incandescent lamp, a xenon lamp, carbon arc lamp and the like. The exposure time will vary depending upon the exposure technique employed and the sensitivity of the photosensitive material. Preferably the light intensity of the light source, the distance between the light source and the photosensitive material and the position of the light source is so arranged so that imagewise exposure is performed for about 3 sec to about 5 min, preferably about 5 sec to about 60 sec. Then, the photosensitive layer is developed with an etching solution, the metal image-forming layer is etched either simultaneously with the development (using a monobath developing method) or subsequent to the development (using a two-bath developing method), and if desired, the resist formed by the photosensitive resin layer is removed. Suitable examples of etching solutions are e.g., as disclosed in, for example, Japanese Patent Application (OPI) Nos. 65927/73 (corresponding to U.S. Patent Application Ser. No. 205,860, filed Dec. 8, 1971), 65928/73 (corresponding to U.S. Patent Application Ser. No. 205,861, filed Dec. 8, 1971), 2925/75 (corresponding to U.S. Patent Application Ser. No. 350,372, filed Apr. 12, 1973) and 139720/75 (corresponding to U.S. Patent Application Ser. No. 571,817, filed Apr. 1975) and Japanese Patent Publication No. 14161/75. The photoresist can be suitably removed by immersing such in or spraying such with an organic solvent such as 1,1,1-trichloroethane, carbon tetrachloride, p-xylene, toluene, benzene, tetrahydrofuran and the like, and, if desired, followed by rubbing with a brush or a cotton pad.

In the two-bath method which comprises exposing the metal image-forming material, developing the photosensitive resin layer, and then etching the metal image-forming layer, the metal image-forming layer can be etched using known methods chosen according to the image-forming metal used, after developing the photosensitive resin layer with a specific developer. However, in the monobath method, especially when an aluminum/iron alloy is used in the metal image-forming layer, the developer solution is preferably an aqueous solution with a pH of at least about 11 containing a strong base such as sodium hydroxide, calcium hydroxide or lithium hydroxide. Desirable etchability can be imparted to this solution by further adding 0.1 to 10% by weight of a halogen-containing oxyacid salt such as an alkali metal hypochlorite, an alkali metal chlorate, an alkali metal bromite, an alkali metal bromate, or an alkali metal periodate, and an alkali metal phosphate, and if required, an organic solvent such as Cellosolve acetate or benzyl alcohol. The "etchability", as used herein, denotes the time required for etching and the sharpness of the etched areas. A short etching time means good developability of the image, and the sharpness of the edges of the etched areas is one requirement for obtaining images of good quality. The various process steps for the formation of metal images are already known, e.g., as disclosed in, for example, Japanese Patent Application (OPI) Nos. 65927/73 (corresponding to U.S. Patent Application Ser. No. 205,860, filed Dec. 8, 1971), 65928/73 (corresponding to U.S. Patent Application Ser. No. 205,861, filed Dec. 8, 1971), 2925/75 (corresponding to U.S. Patent Application Ser. No. 350,372, filed Apr. 12, 1973) and 139720/75 (corresponding to U.S. Patent Application Ser. No. 571,817, filed Apr. 25, 1975) and Japanese Patent Publication No. 14161/75, and a detailed description is not included herein as a result.

Since the protective layer of an organic compound is provided on the photosensitive resin layer, the surface coating of the metal image-forming material of the invention is improved. In particular, the photosensitive resin layer has improved scratch resistance and the resistance of the photosensitive resin layer to blocking with respect to itself and to the surface of the support can be markedly improved. Difficulties due to poor scratch resistance and antiblocking property scarcely occur in the metal image-forming material of this invention either during storage, during handling in an image-forming process, or after formation of images. Thus, a waste of material and labor can be avoided, and images of very good quality can be formed. Hence, the present invention is very useful in the art.

The following Examples and Comparative Examples are given to illustrate the present invention in greater detail. Unless otherwise indicated herein, all parts, percents, ratios and the like are by weight.

COMPARATIVE EXAMPLE 1

An $Al_5Fe$ alloy as an evaporation source was placed in a tungsten boat disposed within a vacuum deposition apparatus, and a 100μ thick polyethylene terephthalate film was disposed in the form of an arc within the vacuum deposition apparatus at a position about 30 cm away from the above evaporation source. Under a vacuum of $5 \times 10^{-5}$ torr, vacuum deposition was performed until a thickness monitor (DTM-200 type monitor, a product of Sloan Co., Ltd.) connected to the vacuum deposition apparatus indicated that the thickness of the deposited film was 600 Å. A photosensitive composition of the following formulation was coated on the vacuum-deposited metal image-forming layer to a thickness of 1.5μ (dry), and dried at 100° C. for 2 minutes.

| Formulation of Photosensitive Composition | |
|---|---|
| Adduct of an Acetone/Pyrogallol Condensate (degree of condensation of about 3) with 1,2-Napthoquinone-diazide-4-sulfonyl Chloride (described in Example 1 of U.S. Pat. No. 3,635,709 (corresponding to British Patent No. 1,113,759) | 0.5 g |
| Novolak-type Phenolic Resin, "SUMILIGHT RESIN P.R. 50904 (a product of Sumitomo Chemical Co., Ltd.) | 1 g |
| Methyl Cellosolve Acetate | 12 g |
| 1,2-Dichloroethane | 18 g |

The resulting metal image-forming material was designated as Comparative Sample 1.

EXAMPLE 1

A sample having the same structure as Comparative Sample 1 was prepared in the same way as in Comparative Example 1, and cut into a piece with a size of 32 cm × 32 cm. A composition of 50 cc of n-hexane and 80 mg of stearic acid was coated on the piece, and dried at 30° C. for 2 minutes. The resulting product was designated as Sample 1.

Each of Sample 1 and Comparative Sample 1 was exposed for 40 seconds using a metal halide lamp (PS Light, an exposure device made by Fuji Photo Film Co., Ltd.) at a distance of 1 m, and then developed for 25 seconds with a developer solution of the following formulation held at 31° C.

| Formulation of Developer Solution | |
|---|---|
| Sodium Hydroxide | 4 g |
| Potassium Bromate | 10 g |
| Sodium Phosphate ($Na_3PO_4 \cdot 12H_2O$) | 10 g |
| Water | 1 liter |

This resulted in the development of the photosensitive resin layer and the etching of the metal image-forming layer in the metal image-forming material.

In each of the samples, the resulting image had an optical density of more than 3.0, and a resolving power of more than 100 lines/mm.

Using a scratch resistance tester (made by Shinto Kagaku Co., Ltd.) equipped with a diamond needle, the scratch resistance of the solid portion of each sample was measured. The results obtained are shown in Table 1.

TABLE 1

| Sample | Before Development (g) | After Development (g) |
|---|---|---|
| Comparative Sample 1 | 10–15 | 10–15 |
| Sample 1 | 60 | 80 |
| Lithographic Film (for purposes of reference) | 40 | 50 |

The antiblocking property of the photosensitive resin layer with respect to the layer itself and to the surface of the polyethylene terephthalate film were tested using the following method.

Test Method for Antiblocking Property

Five samples each cut to a size of 35 mm × 35 mm were prepared, and were superposed so that the surface of a given sample contacted the back of an adjacent sample. A spindle having a weight of 3 kg was placed on the assembly, and the assembly was allowed to stand in this condition for 15 hours at a temperature of 40° C. and a relative humidity of 80%. The samples were peeled off at the superposed surfaces, and the condition was rated on the following scale. An average value of the five samples was determined.

TABLE 2

| Scale for evaluation of Antiblocking Property | |
|---|---|
| Percentage of Area with Blocking Occurring | Grade |
| 0–1% | A |
| 2–10% | B |
| 11–50% | C |
| 51–100% | D |

Comparative Sample 1 was rated "C", whereas Sample 1 was rated "A".

The above results confirmed that Sample 1 in accordance with this invention has a higher scratch resistance at the photosensitive resin layer and a better antiblocking property than Comparative Sample 1.

COMPARATIVE EXAMPLES 2 TO 12

Comparative Samples 2 to 12 were prepared in the same way as in Comparative Example 1 except as noted in Table 3 below.

TABLE 3

| Photosensitive Resin Layer Coating Solution Formulation (g) | Comparative Example | | | | | | | | | | |
|---|---|---|---|---|---|---|---|---|---|---|---|
| | 2 | 3 | 4 | 5 | 6 | 7 | 8 | 9 | 10 | 11 | 12 |
| Adduct described in Comparative Example 1 | 0.5 | 0.3 | 0.4 | 0.4 | 0.5 | 0.5 | 0.5 | — | — | — | — |
| Methacrylate Copolymer (1) | — | 0.5 | 0.6 | 0.6 | 0.7 | 0.7 | 0.7 | — | — | — | — |
| Methacrylate Copolymer (2) | — | 0.2 | — | — | — | — | — | — | — | — | 1.0 |
| Methacrylate Copolymer (3) | — | — | — | — | — | — | — | 1.0 | 1.0 | 1.0 | — |
| Pentaerythritol Tetraacrylate | — | 0.45 | 0.35 | 0.35 | 0.45 | — | — | 0.8 | — | 0.8 | 0.8 |
| Trimethylol Propane Tetraacrylate | — | — | — | — | — | — | — | — | 0.8 | — | — |
| Phenolic Resin described in Comparative Example 1 | 1.0 | — | — | — | — | — | — | — | — | — | — |
| Chlorinated Polyethylene (4) | 0.1 | 0.1 | 0.1 | 0.2 | — | — | 0.1 | 0.2 | 0.2 | — | 0.1 |
| N-Methyl-2-benzoylmethylene-β-Napthothiazole | — | 0.05 | 0.05 | — | 0.05 | — | 0.05 | 0.05 | 0.5 | 0.05 | 0.05 |
| Triphenyl Phosphate | — | — | 0.07 | 0.07 | 0.07 | 0.45 | 0.45 | 0.07 | 0.07 | — | — |
| Ethylene Glycol Diglycidyl Ether (5) | — | — | 0.03 | — | — | — | — | 0.03 | 0.03 | — | — |
| Behenic Acid | — | — | — | 0.01 | — | — | — | 0.02 | 0.02 | — | — |
| 5-Nitroacenaphthene | — | — | — | — | — | 0.05 | — | — | — | — | — |
| Methyl Cellosolve Acetate | 12.0 | 12.0 | 12.0 | 12.0 | 12.0 | 12.0 | 12.0 | 6.0 | 6.0 | 12.0 | 12.0 |
| 1,2-Dichloroethane | 18.0 | 18.0 | 18.0 | 18.0 | 18.0 | 18.0 | 18.0 | 9.0 | 9.0 | 18.0 | 18.0 |
| Photosensitive Resin Layer and Metal Layer Etching Solution Formulation (g) | 2 | 3 | 4 | 5 | 6 | 7 | 8 | 9 | 10 | 11 | 12 |
| Sodium Hydroxide | 4 | 3 | 3 | 4 | 4 | 4 | 4 | 4 | 4 | 4 | 4 |
| Sodium Bromite | 5 | 5 | 5 | 10 | 10 | 5 | 5 | 10 | 10 | 10 | 10 |
| Sodium Phosphate | 5 | 5 | 5 | 5 | 5 | 5 | 5 | 10 | 10 | 10 | 10 |
| Water (l) | 1 | 1 | 1 | 1 | 1 | 1 | 1 | 1 | 1 | 1 | 1 |
| Etching Time (seconds) | 40 | 30 | 30 | 40 | 35 | 35 | 35 | 30 | 30 | 30 | 30 |

Note
(1) A condensation product between p-phenylenediacrylic acid and 1,4-bis(β-hydroxyethoxy)cyclohexane (degree of condensation about 3; intrinsic viscosity [η] at 30° C. in methyl ethyl ketone, 0.15).
(2) Poly(β-cynnamoyloxyethyl methacrylate/methacrylic acid) (molar ratio 90:10; [η] 0.14).
(3) Poly(methyl methacrylate/methacrylic acid) (molar ratio 90:10; [η] 0.12).
(4) SUPERCHLONE 907 LTA-ES (chlorinated polyethylene made by Sanyo Kokusaku Pulp Co., Ltd.; having a viscosity, measured at 25° C. in a 40% toluene solution, of 70 to 120 centipoises; chlorine content: not less than 66% by weight).
(5) EPIOL G-100 (a trademark for a product of Nihon Yushi Co., Ltd.; having a specific gravity of 1.23 at 20° C.; soluble in water with white turbidity and soluble in methanol, ethanol, benzene, and insoluble in kerosene; being represented by the following chemical formula

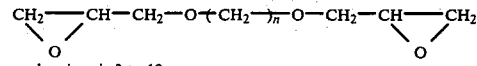

wherein n is 3 to 10.

These Comparative Samples 2 to 12 were compared with Samples 2 to 12 to be described below.

EXAMPLES 2 TO 12

Samples having the same structures as Comparative Samples 2 to 12 were prepared in the same way as in Comparative Examples 2 to 12, and were cut each to a size of 32 cm × 32 cm. A composition of 500 cc of n-hexane and 80 mg of stearic acid was coated on each of the samples, and dried at 30° C. for 2 minutes. The resulting products were designated as Samples 2 to 12.

The images obtained in these samples had an optical density of more than 3.0, and a resolving power of more than 100 lines/mm.

The scratch resistance and antiblocking property of Comparative Samples 2 to 12 and Samples 2 to 12 were each tested in the same way as in Example 1 and Comparative Example 1. Samples were compared with comparative samples of the corresponding numbers (for example, Sample 2 with Comparative Sample 2, and so on), and the results are shown in Tables 4 and 5 below.

TABLE 4

| Time of measurement | | Measured Values of Scratch Resistance (g) | | | | | | | | | | |
|---|---|---|---|---|---|---|---|---|---|---|---|---|
| | | Sample No. | | | | | | | | | | |
| | | 2 | 3 | 4 | 5 | 6 | 7 | 8 | 9 | 10 | 11 | 12 |
| Before Development | Sample | 50–60 | 50–60 | 50–60 | 50–60 | 50–60 | 50–60 | 50–60 | 50–60 | 50–60 | 50–60 | 50–60 |
| | Comparative Sample | 15 | 10–15 | 10–15 | 25–30 | 10–15 | 10–15 | 10–15 | 30–35 | 30–35 | 10–15 | 10–15 |
| After Development | Sample | 25–30 | 45–50 | 45–50 | 45–50 | 45–50 | 45–50 | 45–50 | 45–50 | 45–50 | 45–50 | 45–50 |
| | Comparative Sample | 15 | 20–25 | 20–25 | 20–25 | 30–35 | 20–25 | 20–25 | 20–25 | 35–40 | 20–25 | 20–25 |

TABLE 5

| | Evaluation of Antiblocking Property | | | | | | | | | | |
|---|---|---|---|---|---|---|---|---|---|---|---|
| | Sample No. | | | | | | | | | | |
| | 2 | 3 | 4 | 5 | 6 | 7 | 8 | 9 | 10 | 11 | 12 |
| Sample | A | A-B | A-B | A | A-B | A-B | A-B | B-C | B-C | B-C | B-C |
| Comparative Sample | B-A | B | B | B | B | B | B | C | C | C | C |

From the above comparisons, it has been confirmed that Samples 2 to 12 in accordance with this invention have a higher film strength at the photosensitive resin layer and a much better antiblocking propery than Comparative Samples 2 to 12.

EXAMPLES 13 TO 23

Samples having the same structure as Comparative Samples 2 to 12 were prepared in the same way as in Comparative Examples 2 to 12, and each cut to a size of 32×32 cm. A coating solution of the following formulation;

| Formulation of Coating Solution | |
|---|---|
| n-Hexane | 48 cc |
| Stearic Acid | 80 mg |
| Acetone | 2 cc |
| Rosin ("ROSIN NCY", a trademark for a product of Arakawa Rinsan Kagaku Kogyo Co., Ltd.) | 80 mg | was coated further on the cut samples, and dried at 30° C. for 2 minutes. The resulting products were designated as Samples 13 to 23.

The images formed in Samples 13 to 23 had an optical density of more than 3.0, and a resolving power of more than 100 lines/mm.

The scratch resistance and antiblocking property of these samples were tested, and compared with the values for Comparative Samples 2 to 12. The results obtained are shown in Tables 6 and 7 below.

TABLE 6

Measured Values of Scratch Resistance (g)

| | | (No.) | | | | | | | | | | |
|---|---|---|---|---|---|---|---|---|---|---|---|---|
| | | 13 | 14 | 15 | 16 | 17 | 18 | 19 | 20 | 21 | 22 | 23 |
| Before Development | Sample | 50–60 | 50–60 | 50–60 | 50–60 | 50–60 | 50–60 | 50–60 | 50–60 | 50–60 | 50–60 | 50–60 |
| | | (No.) | | | | | | | | | | |
| | | 2 | 3 | 4 | 5 | 6 | 7 | 8 | 9 | 10 | 11 | 12 |
| | Comparative Sample | 15 | 10–15 | 10–15 | 25–30 | 10–15 | 10–15 | 10–15 | 30–35 | 30–35 | 10–15 | 10–15 |
| | | (No.) | | | | | | | | | | |
| | | 13 | 14 | 15 | 16 | 17 | 18 | 19 | 20 | 21 | 22 | 23 |
| After Development | Sample | 20 | 45–50 | 45–50 | 45–50 | 45–50 | 45–50 | 45–50 | 45–50 | 45–50 | 45–50 | 20–25 |
| | | (No.) | | | | | | | | | | |
| | | 2 | 3 | 4 | 5 | 6 | 7 | 8 | 9 | 10 | 11 | 12 |
| | Comparative Sample | 15 | 20–25 | 20–25 | 30–35 | 20–25 | 20–25 | 20–25 | 35–40 | 35–40 | 20–25 | 20–25 |

TABLE 7

Evaluation of Antiblocking Property

| | (No.) | | | | | | | | | | |
|---|---|---|---|---|---|---|---|---|---|---|---|
| | 13 | 14 | 15 | 16 | 17 | 18 | 19 | 20 | 21 | 22 | 23 |
| Sample | A | A | A | A | A | B | B | B | B | B | B |
| | (No.) | | | | | | | | | | |
| | 2 | 3 | 4 | 5 | 6 | 7 | 8 | 9 | 10 | 11 | 12 |

TABLE 7-continued

Evaluation of Antiblocking Property

| Comparative Sample | B | B | B | B | B | C | C | C | C | C | C |
|---|---|---|---|---|---|---|---|---|---|---|---|

From the above comparisons, it has been confirmed that Samples 13 to 23 in accordance with the present invention have a higher film strength at the photosensitive resin layer and a much better antiblocking property than Comparative Samples 2 to 12. The surface of each of Samples 13 to 23 was slightly mat-like, and this seemed to contribute to the improvement in their antiblocking properties.

EXAMPLES 24 TO 33

Samples having the same structures as Comparative Samples 3 to 12 were prepared in the same way as in Comparative Examples 3 to 12, and were cut each to a size of 32 cm × 32 cm. A coating solution of the following formulation;

| Formulation of Coating Solution | |
|---|---|
| Methanol | 35 cc |
| Alcohol-soluble Nylon (M-4 Nylon, a product of Toray Industries, Inc.) | 1 g |
| Water | 15 cc | was coated on each of the cut samples, and dried at 30° C. for 2 minutes. The resulting products were designated as Samples 24 to 33.

The images formed on Samples 24 to 34 had an optical density of more than 3.0, and a resolving power of more than 100 lines/mm. The scratch resistance and antiblocking property of these samples were tested and compared with those of Comparative Samples 3 to 12. The results obtained are shown in Tables 8 and 9 below.

Measured Values of Scratch Resistance (g)

| | | No. | | | | | | | | | |
|---|---|---|---|---|---|---|---|---|---|---|---|
| | | 24 | 25 | 26 | 27 | 28 | 29 | 30 | 31 | 32 | 33 |
| Before Development | Sample | 25–30 | 25–30 | 30–35 | 25–30 | 25–30 | 25–30 | 25–30 | 25–30 | 25–30 | 25–30 |
| | | (No.) | | | | | | | | | |
| | | 3 | 4 | 5 | 6 | 7 | 8 | 9 | 10 | 11 | 12 |

Measured Values of Scratch Resistance (g) (continued)

| | | \multicolumn{10}{c}{(No.)} |
|---|---|---|---|---|---|---|---|---|---|---|---|
| | Comparative Sample | 10–15 | 10–15 | 25–30 | 10–15 | 10–15 | 10–15 | 30–35 | 30–35 | 10–15 | 10–15 |

| | | 24 | 25 | 26 | 27 | 28 | 29 | 30 | 31 | 32 | 33 |
|---|---|---|---|---|---|---|---|---|---|---|---|
| After Development | Sample | 30–35 | 30–35 | 35–40 | 30–35 | 30–35 | 30–35 | 35–40 | 35–40 | 30–35 | 30–35 |

| | | 3 | 4 | 5 | 6 | 7 | 8 | 9 | 10 | 11 | 12 |
|---|---|---|---|---|---|---|---|---|---|---|---|
| | Comparative Sample | 20–25 | 20–25 | 30–35 | 20–25 | 20–25 | 20–25 | 35–40 | 35–40 | 20–25 | 20–25 |

TABLE 9

Evaluation of Antiblocking Property

| | 24 | 25 | 26 | 27 | 28 | 29 | 30 | 31 | 32 | 33 |
|---|---|---|---|---|---|---|---|---|---|---|
| Sample | A | A | A | A | A-B | A-B | A-B | A-B | A-B | A-B |

| | 3 | 4 | 5 | 6 | 7 | 8 | 9 | 10 | 11 | 12 |
|---|---|---|---|---|---|---|---|---|---|---|
| Comparative Sample | B | B | B | B | C | C | C | C | C |

From the above comparisons, it has been confirmed that Samples 24 to 33 in accordance with this invention have a higher film strength at the photosensitive resin layer and a much better antiblocking property than Comparative Samples 3 to 12. The surfaces of Samples 24 to 33 all had a mat finish, and the surfaces could be easily distinguished from their backs. Furthermore, this seemed to contribute to the improvement in their antiblocking properties.

EXAMPLES 34 TO 43

Samples having the same structures as Comparative Samples 3 to 12 were prepared in the same way as in Comparative Examples 3 to 12, and were cut each to a size of 32 cm×32 cm. A coating solution of the following formulation;

| Formulation of the Coating Solution | |
|---|---|
| Alcohol-soluble Nylon (M-Nylon, a product of Toray Industries, Inc.) A Methanol dispersion con- | 1 g |
| taining 30% of colloidal silica | 2 g |
| Methanol | 35 cc |
| Water | 15 cc | was coated on the cut samples, and dried at 30° C. for 2 minutes. The products were designated Samples 34 to 43.

The images obtained in Samples 34 to 43 had an optical density of more than 3.0, and a resolving power of more than 100 lines/mm. The scratch resistance and antiblocking property of Samples 34 to 43 were tested, and compared with those of Comparative Samples 3 to 12. The results obtained are shown in Tables 10 and 11 below.

TABLE 10

Measured Values of Scratch Resistance (g)

| | | 34 | 35 | 36 | 37 | 38 | 39 | 40 | 41 | 42 | 43 |
|---|---|---|---|---|---|---|---|---|---|---|---|
| Before Development | Sample | 25–30 | 25–30 | 30–35 | 25–30 | 25–30 | 25–30 | 25–30 | 25–30 | 25–30 | 25–30 |

| | | 3 | 4 | 5 | 6 | 7 | 8 | 9 | 10 | 11 | 12 |
|---|---|---|---|---|---|---|---|---|---|---|---|
| | Comparative Sample | 10–15 | 10–15 | 25–30 | 10–15 | 10–15 | 10–15 | 30–35 | 30–35 | 10–15 | 10–15 |

| | | 34 | 35 | 36 | 37 | 38 | 39 | 40 | 41 | 42 | 43 |
|---|---|---|---|---|---|---|---|---|---|---|---|
| After Development | Sample | 30–35 | 30–35 | 35–40 | 30–35 | 30–35 | 30–35 | 35–40 | 35–40 | 30–35 | 30–35 |

| | | 3 | 4 | 5 | 6 | 7 | 8 | 9 | 10 | 11 | 12 |
|---|---|---|---|---|---|---|---|---|---|---|---|
| | Comparative Sample | 20–25 | 20–25 | 30–35 | 20–25 | 20–25 | 20–25 | 35–40 | 35–40 | 20–25 | 20–25 |

TABLE 11

Evaluation of Antiblocking Property

| | 34 | 35 | 36 | 37 | 38 | 39 | 40 | 41 | 42 | 43 |
|---|---|---|---|---|---|---|---|---|---|---|
| Sample | A | A | A | A | A | A | A | A | A | A |

| | 3 | 4 | 5 | 6 | 7 | 8 | 9 | 10 | 11 | 12 |
|---|---|---|---|---|---|---|---|---|---|---|
| Comparative Sample | B | B | B | B | B | C | C | C | C | C |

From the above comparison, it has been confirmed that Samples 34 to 43 have a higher film strength at the photosensitive resin layer and a much better blocking property than Comparative Samples 3 to 12. In Samples 34 to 43, the surfaces had a mat-finish to a greater degree, and their antiblocking properties were improved further.

EXAMPLE 44

A sample having the same structure as Comparative Sample 7 was prepared in the same way as in Comparative Example 7, and cut to a size of 32 cm×32 cm. A coating solution of the following formulation;

| Formulation of Coating Solution | |
|---|---|
| Chlorinated Polyethylene (SUPERCHLONE LTA, a trademark for a product of Sanyo Kokusaku Pulp Co., Ltd.; viscosity in a 40% by weight toluene solution at 25° C.: about 90 cps; chlorine content: not less than 66% by weight) | 0.03 g |
| Acetone | 3 g |
| n-Hexane | 27 g | was further coated on the sample, and dried at 30° C. for 2 minutes. The product was designated Sample 44.

The scratch resistance and antiblocking property of Sample 44 was tested. It was found to have a higher scratch resistance and a better antiblocking property than Comparative Sample 7, and the intended effect of the invention was observed.

EXAMPLES 45 AND 46 AND COMPARATIVE EXAMPLES 13 AND 14

Example 1 and Comparative Example 1 were repeated except that bismuth and tellurium were used respectively as an evaporation source instead of the Al$_5$Fe alloy. Samples 45 and 46 and Comparative Samples 13 and 14 were prepared.

Each of the samples was exposed imagewise in the same way as in Example 1, and developed for 25 seconds with a developer solution of 14 g of sodium silicate and 1 liter of water held at 31° C. Then, Sample 45 and Comparative Sample 13 both containing a bismuth layer were each processed with an etching solution of 6 g of ferric chloride and 100 cc of water. On the other hand, Sample 46 and Comparative Sample 14 both having a tellurium layer were each processed with an etching solution of 100 cc of an aqueous solution containing 0.4 mole of sodium hypochlorite and 1% by weight of sodium bicarbonate for 1 second. The temperatures used in etching with these solutions were 20° C.

The images formed in these samples had an optical density of more than 3.0, and a resolving power of more than 100 lines/mm.

The scratch resistance and antiblocking property of the samples were tested. It was found that Samples 45 and 46 had a higher scratch resistance and a better antiblocking property than Comparative Samples 13 and 14, respectively.

EXAMPLE 47

Same procedures as in Example 13 were repeated except that 80 mg of abietic acid was used for ROSIN NCY. The same results as in Example 13 were obtained.

While the invention has been described in detail and with reference to specific embodiments thereof, it will be apparent to one skilled in the art that various changes and modifications can be made therein without departing from the spirit and scope thereof.

What is claimed is:

1. A method for producing a metal image which comprises (1) exposing a metal image-forming material comprising a support, a metal layer formed on the support, a photosensitive resin layer formed on the metal layer and a protective layer formed on the photosensitive resin layer, said metal layer being etchable with an aqueous alkaline solution, said photosensitive resin layer being developable with an aqueous alkaline solution and said protective layer being aqueous alkaline solution permeable and consisting essentially of a member selected from the group consisting of a higher fatty acid having 11 to 31 carbon atoms excluding the carbon atom(s) of the carboxyl group(s) thereof or an alcohol-soluble nylon, and (2) developing the exposed photosensitive resin layer to form a resist and etching the metal layer with an aqueous alkaline solution or aqueous alkaline solutions, to thereby form a metal image having a resist layer thereon and said protective layer on said resist layer.

2. The method of claim 1, wherein the protective layer consists essentially of a higher fatty acid having 11 to 31 carbon atoms excluding the carbon atom(s) of the carboxyl group(s) thereof.

3. The method of claim 1, wherein the protective layer consists essentially of an alcohol soluble nylon.

4. The method of claim 1, wherein said higher fatty acid contains at least 12 carbon atoms.

5. The method of claim 1, wherein said support is transparent.

6. The method of claim 1, wherein said protective layer has a thickness of not more than about 5μ.

7. The method of claim 1, wherein said metal image-forming layer is etchable in the same aqueous alkaline solution to which said protective layer is permeable, said aqueous alkaline solution penetrating said protective layer.

8. The method of claim 1, wherein said higher fatty acid is stearic acid.

9. The method of claim 1, wherein development and etching are carried out simultaneously using a monobath developer.

10. The method of claim 1, wherein etching is carried out subsequent to development using a 2-bath developer.

11. The method of claim 1, wherein said protective layer is in the form of a film.

12. The method of claim 1, wherein said protective layer is in a dispersed state on the photosensitive layer.

13. The method of claim 1, wherein said protective layer comprises said higher fatty acid having 11 to 31 carbon atoms excluding the carbon atom(s) of the carboxyl group(s) thereof and said fatty acid is present as a monomolecular layer.

14. The method of claim 1, wherein said protective layer comprises said higher fatty acid having 11 to 31 carbon atoms excluding the carbon atom(s) of the carboxyl group(s) thereof and has a thickness of 0.005 to 0.5μ.

15. The method of claim 1, wherein said protective layer comprises said alcohol-soluble nylon and has a thickness of 0.1 to 3μ.

16. The method of claim 1, wherein said higher fatty acid has 11 to 21 carbon atoms excluding the carbon atom(s) of the carboxyl group(s) thereof.

17. The method of claim 1, wherein the photosensitive resin in the photosensitive resin layer comprises an ortho-quinone diazide with a novolak resin.

18. The method of claim 1, wherein the photosensitive resin in the photosensitive resin layer is a photosensitive resin comprising a photosensitive unsaturated polyester and a compound containing groups (A) and (B) below:

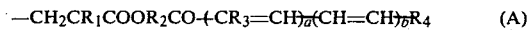

$$-CH_2CR_1COOR_2CO-(CR_3=CH)_a(CH=CH)_bR_4 \quad (A)$$

wherein $R_1$ is a hydrogen atom, a halogen atom, a nitrile group, or a lower alkyl group; $R_2$ is a divalent aliphatic group; $R_3$ is a hydrogen atom or a nitrile group; $R_4$ is an aromatic group; a and b each is 0 or 1; and a+b is 1 or 2; and

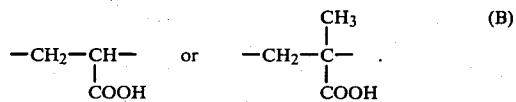

19. The method of claim 1, wherein the metal image-forming layer is a metal containing aluminum as a main ingredient.

20. The method of claim 1, wherein the photosensitive resin layer contains a photopolymerizable monomer.

21. The method of claim 1, wherein the photosensitive resin layer contains a cross-linkable polymer.

22. The method of claim 1, wherein the photosensitive resin layer contains a photosensitive material resulting from the addition of 1,2-naphthoquinone diazide sulfonyl chloride to an acetone/pyrogallol condensate.

23. The method of claim 19, wherein the metal containing aluminum as a main ingredient is an alloy of aluminum and iron.

* * * * *